(12) United States Patent
Schulze et al.

(10) Patent No.: US 8,823,089 B2
(45) Date of Patent: Sep. 2, 2014

(54) SIC SEMICONDUCTOR POWER DEVICE

(75) Inventors: Hans-Joachim Schulze, Taufkirchen (DE); Roland Rupp, Lauf (DE)

(73) Assignee: Infineon Technologies AG, Neubiberg (DE)

( * ) Notice: Subject to any disclaimer, the term of this patent is extended or adjusted under 35 U.S.C. 154(b) by 482 days.

(21) Appl. No.: 13/087,780

(22) Filed: Apr. 15, 2011

(65) Prior Publication Data

US 2012/0261673 A1 Oct. 18, 2012

(51) Int. Cl.
*H01L 29/76* (2006.01)
*H01L 31/062* (2012.01)
*H01L 29/06* (2006.01)
*H01L 29/161* (2006.01)
H01L 29/16 (2006.01)
H01L 29/417 (2006.01)
H01L 29/778 (2006.01)
H01L 29/872 (2006.01)
H01L 29/78 (2006.01)

(52) U.S. Cl.
CPC ........... *H01L 29/161* (2013.01); *H01L 29/1606* (2013.01); *H01L 29/41741* (2013.01); *H01L 29/41766* (2013.01); *H01L 29/7781* (2013.01); *H01L 29/872* (2013.01); *H01L 29/7838* (2013.01); *H01L 29/0653* (2013.01); *H01L 29/0649* (2013.01); *H01L 29/41775* (2013.01); *H01L 29/0692* (2013.01); *H01L 29/0657* (2013.01); *H01L 29/7828* (2013.01); *H01L 29/1608* (2013.01); *H01L 29/7788* (2013.01); *H01L 29/417* (2013.01)
USPC .............. 257/331; 257/76; 257/328; 257/24; 257/E29.104

(58) Field of Classification Search
CPC ............ H01L 29/1606; H01L 29/1608; H01L 29/7395; H01L 29/7827
USPC ................. 257/331, 328, 76, 77, 24, E29.104
See application file for complete search history.

(56) References Cited

U.S. PATENT DOCUMENTS

| | | | |
|---|---|---|---|
| 7,498,633 B2 | 3/2009 | Cooper et al. | |
| 8,076,204 B2 * | 12/2011 | Anderson et al. | 438/283 |
| 2005/0167742 A1 * | 8/2005 | Challa et al. | 257/328 |
| 2010/0051897 A1 | 3/2010 | Chen et al. | |
| 2010/0224886 A1 * | 9/2010 | Iwamuro | 257/77 |
| 2011/0193100 A1 | 8/2011 | Tsuchiya et al. | |
| 2012/0074387 A1 | 3/2012 | King | |

OTHER PUBLICATIONS

Avouris, P., "Graphene: Electronic and Photonic Properties and Devices", Nano Letters, American Chemical Society.
Oostinga, J. B., "Gate-induced insulating state in bilayer graphene devices", Nature Materials, vol. 7, Feb. 2008, pp. 151-157, 2008 Nature Publishing Group, published online Dec. 2, 2007, www.nature.com/naturematerials.

(Continued)

*Primary Examiner* — Shouxiang Hu
(74) *Attorney, Agent, or Firm* — Murphy, Bilak & Homiller, PLLC

(57) ABSTRACT

A semiconductor power device includes a SiC semiconductor body. At least part of the SiC semiconductor body constitutes a drift zone. A first contact is at a first side of the SiC semiconductor body. A second contact is at a second side of the SiC semiconductor body. The first side is opposite the second side. A current path between the first contact and the second contact includes at least one graphene layer.

12 Claims, 4 Drawing Sheets

(56) References Cited

OTHER PUBLICATIONS

Tzalenchuk, A., "Towards a quantum resistance standard based on epitaxial graphene", Nature Nanotechnology, vol. 5, Mar. 2010, 2010 Macmillan Publishers Limited.

Raineri, V., "The graphene/SiC interface and local transport properties", IMM, ECSCRM 2010—Sundvolden (Oslo), Norway—Slides 0/21.

Virojanadara, C., Large homogeneous mono-/bi-layer graphene on 6H-SiC (0001) and buffer layer elimination, Journal of Physics D: Applied Physics, 2010 IOP Published Ltd, Printed in the UK and US.

ScienceDaily, "Scientists Demonstrate World's Fastest Graphene Transistor; Holds Promise for Improving Performance of Transistors", Feb. 7, 2010, http://www.science,daily.com/releases/2010/02/100205113551.htm.

Spitz, J. et al., "2.6 kV 4H-SiC Lateral DMOSFET's" IEEE Electron Device Letters, vol. 19, 1998, No. 4, pp. 100-102.

* cited by examiner

SIC SEMICONDUCTOR POWER DEVICE

BACKGROUND

Silicon carbide (SiC) is widely used in high-temperature/high-voltage semiconductor electronics owing to a high thermal conductivity and a wide band gap of SiC. A specific on-state resistance $R_{on} \times A$ is a key parameter of SiC power semiconductor devices. It is desirable to improve the specific on-state resistance $R_{on} \times A$ of SiC vertical power semiconductor devices.

SUMMARY

According to an embodiment of a vertical semiconductor power device, the vertical semiconductor power device includes a SiC semiconductor body. At least part of the SiC semiconductor body constitutes a drift zone. The vertical semiconductor power device further includes a first contact at a first side of the SiC semiconductor body and a second contact at a second side of the SiC semiconductor body. The first side is opposite the second side. A current path between the first contact and the second contact includes at least one graphene layer.

According to another embodiment of a vertical semiconductor power device, the vertical semiconductor power device includes a SiC semiconductor body. At least part of the SiC semiconductor body constitutes a drift zone. The vertical semiconductor power device further includes a first contact at a first side of the SiC semiconductor body and a second contact at a second side of the SiC semiconductor body. The first side is opposite the second side. The vertical semiconductor power device further includes a lateral channel region at the first side. The lateral channel region includes at least one graphene layer.

According to another embodiment of a vertical semiconductor power device, the vertical semiconductor power device includes a SiC semiconductor body. At least part of the SiC semiconductor body constitutes a drift zone. The vertical semiconductor power device further includes a first contact at a first side of the SiC semiconductor body and a second contact at a second side of the SiC semiconductor body. The first side is opposite the second side. The vertical semiconductor power device further includes a plurality of trenches extending into the SiC semiconductor body from the second side. At least one graphene layer is arranged on at least part of a sidewall of the plurality of trenches.

According to an embodiment of a lateral semiconductor power device, the lateral semiconductor power device includes a SiC semiconductor body. At least part of the SiC semiconductor body constitutes a drift zone. The lateral semiconductor power device further includes a source contact at a first side of the SiC semiconductor body and a drain contact at the first side of the SiC semiconductor body. A channel region includes at least one graphene layer. The lateral semiconductor power device is configured to block reverse voltages of at least 500 V and has a lateral distance between a body region and the drain contact of at least 5 μm.

Those skilled in the art will recognize additional features and advantages upon reading the following detailed description, and upon viewing the accompanying drawings.

BRIEF DESCRIPTION OF THE DRAWINGS

The accompanying drawings are included to provide a further understanding of the present invention and are incorporated in and constitute a part of this specification. The drawings illustrate embodiments of the present invention and together with the description serve to explain principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Figure 1:
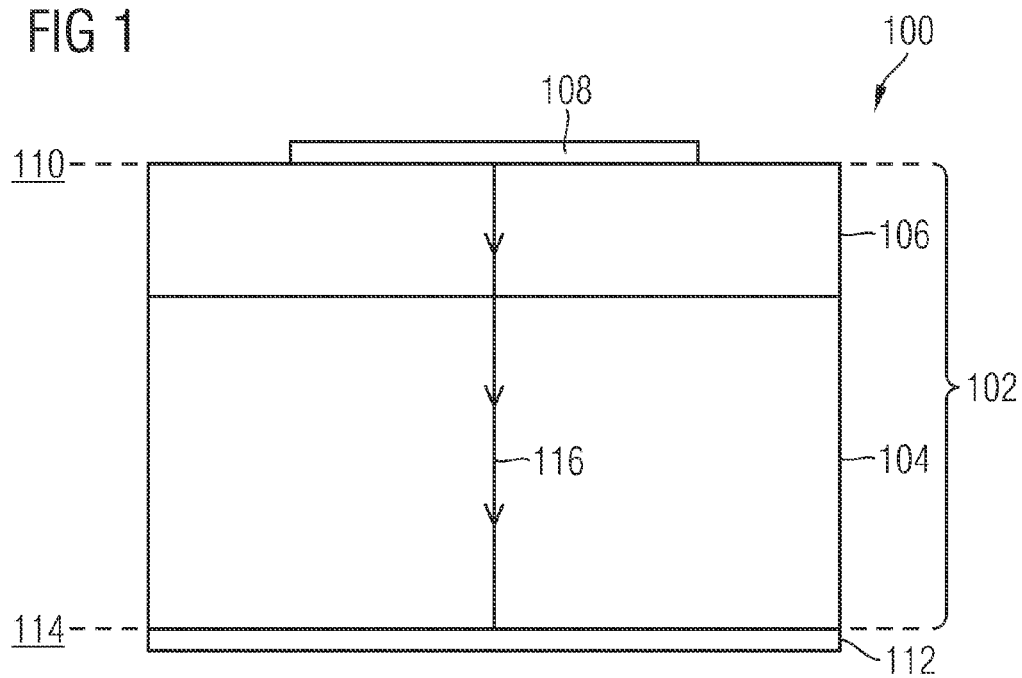
FIG. 1 is a schematic illustration of one embodiment of a SiC vertical semiconductor power device including at least one graphene layer along a current path between a first contact at a first side of a semiconductor body and a second contact at a second side of the semiconductor body.

In the following detailed description, reference is made to the accompanying drawings, which form a part hereof, an in which is shown by way of illustration specific embodiments in which the invention may be practiced. In this regard, directional terminology, such as "top", "bottom", "front", "back", "leading", "trailing", etc., is used with reference to the orientation of the Figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of embodiments are explained below. In this case, identical structural features are identified by identical or similar reference symbols in the Figures. In the context of the present description, "lateral" or "lateral direction" should be understood to mean a direction or extent that runs generally parallel to the lateral extent of a semiconductor material or semiconductor body. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, the terms "coupled" and/or "electrically coupled" are not meant to mean that the elements must be directly coupled together—intervening elements my be provided between the "coupled" or "electrically coupled" elements.

Semiconductor devices including power semiconductor chips are described below. The power semiconductor chips may be of different types, may be manufactured by different technologies and may include, for example, integrated electrical, electro-optical or electro-mechanical circuits or passives. The power semiconductor chips may contain inorganic and/or organic materials that are not semiconductors, such as, for example, discrete passives, antennas, insulators, plastics or metals. Furthermore, the devices described below may include further integrated circuits to control the power integrated circuits of the power semiconductor chips.

The power semiconductor chips may comprise power MOSFETs (Metal Oxide Semiconductor Field Effect Transistors), DMOSFETs (Double-diffused MOSFET), IGBTs (Insulated Gate Bipolar Transistors), JFETs (Junction Gate Field Effect Transistors), power bipolar transistors or power diodes such as power Schottky diodes. More specifically, the power semiconductor chips having a vertical structure are involved, that is to say that the power semiconductor chips, more specifically vertical power semiconductor chips, are fabricated in such a way that electric currents can flow in a direction perpendicular to the main faces of the power semiconductor chips.

A power semiconductor chip having a vertical structure, i.e. vertical power semiconductor chip, may have terminals such as contacts on its two main faces, that is to say on its top side and bottom side, or, in other words, on its front side and rear side. By way of example, the source electrode and the gate electrode of a power MOSFET may be situated on one main face, while the drain electrode of the power MOSFET may be arranged on the other main face. The contacts may be made of aluminum, copper or any other suitable material. One or more metal layers may be applied to the contact pads of the power semiconductor chips. The metal layers may, for example, be made of titanium, nickel vanadium, gold, silver, copper, palladium, platinum, nickel, chromium or any other suitable material. The metal layers need not be homogenous or manufactured from just one material, that is to say various compositions and concentrations of the materials contained in the metal layers are possible.

FIG. 1 illustrates a schematic view of a SiC vertical semiconductor power device 100 according to one embodiment. The SiC vertical semiconductor power device 100 includes a semiconductor body 102. The semiconductor body 102 includes a SiC substrate 104 and an epitaxial SiC layer 106 above the SiC substrate 104. At least part of the epitaxial SiC layer 106 constitutes a drift zone. A first contact 108 is arranged at a first side 110 of the semiconductor body 102. A second contact 112 is arranged at a second side 114 of the semiconductor body 102, the first side 110 being opposite the second side 114. A current path between the first contact 108 and the second contact 112 includes at least one graphene layer. The current path including the at least one graphene layer is schematically illustrated by a line 116.

According to one embodiment, the first contact 108 is one of a source contact/drain contact and the second contact 112 is the other one of the source contact/drain contact of a Field Effect Transistor (FET) such as a Metal Oxide Semiconductor FET (MOSFET), a Junction Field Effect Transistor (JFET), a High Electron Mobility Transistor (HEMT), an Insulated-Gate Bipolar Transistor (IGBT). According to another embodiment, the first contact 108 is one of a cathode contact/anode contact and the second contact 112 is the other one of the cathode contact/anode contact of a vertical semiconductor power diode. The first contact 108 and the second contact 112 include one or a plurality of conductive materials such as metals, metal alloys or doped semiconductors, for example. The conductive material(s) of the first contact 108 may differ or partly differ from the conductive material(s) of the second contact 112. The first contact 108 and the second contact 112 may be formed by patterning a of a conductive layer such as a metal layer. Hence, the first contact 108 and the second contact 112 may constitute a part of a patterned conductive layer, respectively.

The at least one graphene layer constitutes one part of the current path between the first contact 108 and the second contact 112. According to one embodiment, the at least one graphene layer constitutes a part of a drift zone of a vertical semiconductor power FET. The at least one graphene layer and another part of the drift zone, e.g. a portion of the SiC substrate 104 and/or a portion of the epitaxial SiC layer 106, may be connected in parallel. According to another embodiment, the at least one graphene layer constitutes a part of or is equal to a channel region of a vertical semiconductor power FET. The channel region may be at the first side 110 or may adjoin to sidewalls of a trench extending into the semiconductor body 102 from the first side 110. According to yet another embodiment, the at least one graphene layer constitutes a part of a cathode region and/or an anode region of a vertical semiconductor power diode such as a Schottky diode. The at least one graphene layer and a part of the SiC substrate 104 and/or a portion of the epitaxial SiC layer 106 may be connected in parallel.

The term "at least one graphene layer" as used herein means at least one 1-atom thick layer of carbon atoms and thus includes a single-atom thick layer of carbon atoms and a multi-atom thick layer of carbon atoms such as a 2-atoms thick layer, a 3-atoms thick layer, a 4-atoms thick layer, a 5-atoms thick layer, a 6-atoms thick layer of carbon atoms, for example. The at least one graphene layer may be formed by thermal decomposition of SiC at a surface of the SiC substrate 104 and/or the epitaxial SiC layer 106. The term "surface of the SiC substrate 104 and/or the epitaxial SiC layer" as used herein means any surface of the SiC substrate 104 and/or the epitaxial SiC layer and thus includes the surface at a sidewall and at a bottom side of trenches formed in the SiC substrate 104 and/or the epitaxial SiC layer. The formation of the at least one graphene layer by thermal decomposition may be carried out at a temperature range of 1200° C. to 1800° C., for example. As an alternative or in addition to the thermal decomposition of SiC, the at least one graphene layer or a part of the at least one graphene layer may be formed by deposition or epitaxial growth.

In the embodiment illustrated in FIG. 1, the semiconductor body 102 includes the SiC substrate 104 and the epitaxial SiC layer 106. According to another embodiment, the semiconductor body 102 corresponds to a SiC substrate without an epitaxial SiC layer formed thereon.

Owing to the high mobility and high concentration of free charge carriers within the at least one graphene layer, the resistance of that part of the current path between the first contact 108 and the second contact 112 that includes the at least one graphene layer can be decreased. Hence, the specific on-state resistance $R_{on} \times A$ of the SiC vertical power semiconductor device 100 can be improved.

Figure 2A:
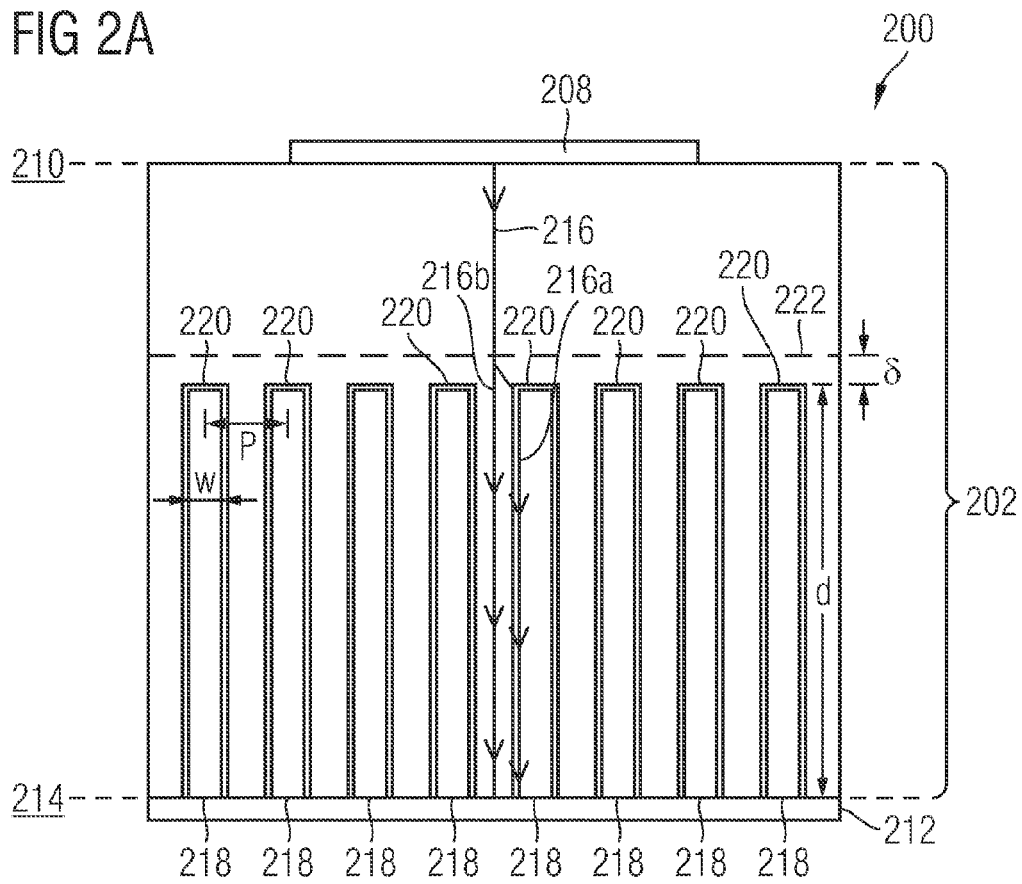
FIG. 2A is a schematic illustration of one embodiment of a SiC vertical semiconductor power device including a current path between a first contact at a first side of a semiconductor body and a second contact at a second side of the semiconductor body, wherein at least one graphene layer arranged at sidewalls of trenches extending into the semiconductor body from the second side constitutes a part of the current path.

FIG. 2A is a schematic illustration of another embodiment of a vertical SiC semiconductor power device 200. The SiC semiconductor power device 200 includes a SiC semiconductor body 202, a first contact 208 at a first side 210 of the SiC semiconductor body 202 and a second contact 212 at a second side 214 of the SiC semiconductor body 202. Trenches 218 extend into the SiC semiconductor body 202 from the second side 214. At least one graphene layer 220 is arranged at sidewalls and at a bottom side of each of the trenches 218.

According to one embodiment, an extension of each of the trenches 218 into the SiC semiconductor body 202 from the second side 214, i.e. a depth d of each of the trenches 218, is in a range of 50 μm to 150 μm. A width w of each of the trenches 218 may be in a range of 50 nm to 500 nm. The trenches 218 may be arranged with a pitch p in a range of 500 nm to 50 μm, in particular in a range of 1 μm to 20 μm.

In the vertical SiC semiconductor power device 200, a distance between a bottom side of the trenches 218 and a space charge region 222 at a maximum operational reverse voltage is denoted by δ. According to one embodiment, the distance δ is positive, e.g. in a range of 1 μm to 10 μm such as 1 μm, 2 μm, 3 μm, 4 μm, 5 μm. Hence, even at the maximum operational reverse voltage, the space charge region 222 does not reach the bottom side of the trenches 218. According to another embodiment, the distance δ is negative, e.g. in a range of 1 μm to 10 μm such as −1 μm, −2 μm, −3 μm, −4 μm, −5 μm. The values of w, δ., p and d may also vary between the trenches 218.

According to one embodiment, the trenches 218 are filled or partly filled with one or a plurality of conductive and/or insulating materials. The material(s) filled into the trenches 218 may be appropriately chosen so as to keep a mechanical strain induced preferably low.

A current path between the first contact 208 and the second contact 212 is schematically illustrated by a line 216. The at least one graphene layer 220 constitutes part of the current path denoted by a line 216a schematically illustrating the current flow along the at least one graphene layer 220 at one sidewall of one of the trenches 218. A part of the SiC semiconductor body 202 between the trenches 218 is connected in parallel to the at least one graphene layer at the sidewalls of the trenches 218. A current flow along the part of the SiC semiconductor body 202 between the trenches 218 is schematically illustrated by a line 216b in FIG. 2A. A conductive material filled into the trenches 218 and electrically coupled to the at least one graphene layer 220 is connected in parallel to the at least one graphene layer 220 and the respective part of the SiC semiconductor body 202.

Figure 2B:
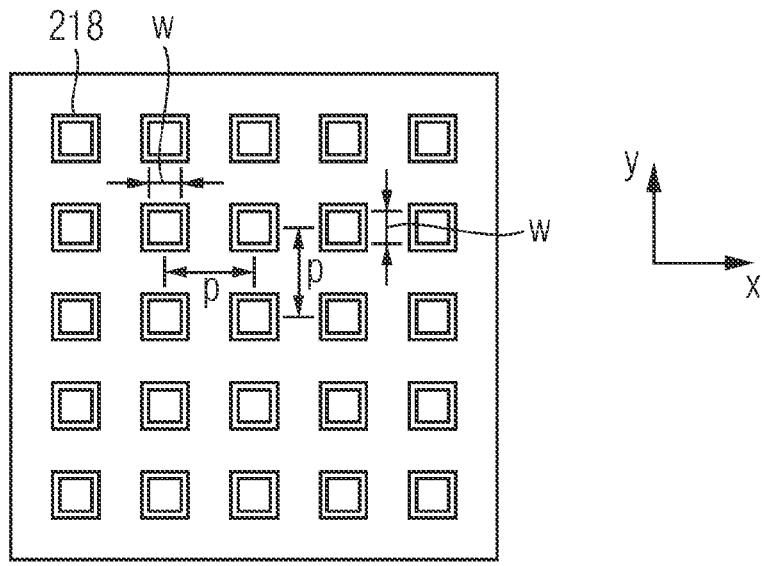
FIG. 2B is a schematic plan view of one embodiment of the second side of the SiC vertical semiconductor power device illustrated in FIG. 2.

FIG. 2B is a schematic plan view of one embodiment of the second side 214 of the SiC semiconductor power device 200 illustrated in FIG. 2A. A pitch p of the trenches along a lateral x direction equals the pitch p of the trenches 218 along a lateral y direction. Likewise, a width w of each of the trenches 218 along the lateral x direction equals the width w of each of the trenches 218 along the lateral y direction. According to another embodiment, the pitch of the trenches 218 along the lateral x direction differs from the pitch of the trenches 218 along the lateral y direction. Likewise, the width of each of the trenches 218 along the lateral x direction differs from the width of each of the trenches 218 along the lateral y direction. According to other embodiments, a shape of the trenches 218 in a lateral plane defined by the lateral x direction and the lateral y direction may differ from a square shape or a rectangular shape and may correspond to the shape of a ring, a circle, a polygon or other shapes, for example. The shape and arrangement of the trenches 218 may be appropriately chosen to increase the amount of graphene per unit area of the lateral plane. Thereby, the specific on-state resistance $R_{on} \times A$ of the SiC vertical power semiconductor device 200 can be improved.

Figure 3:
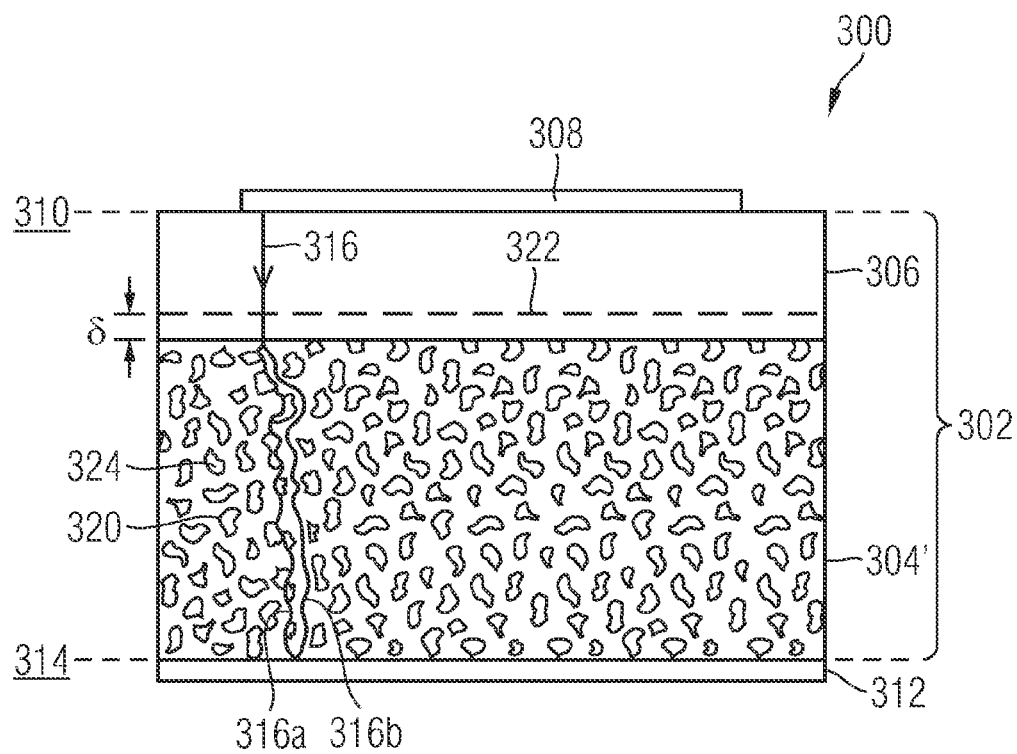
FIG. 3 is a schematic illustration of one embodiment of a SiC vertical semiconductor power device including at least one graphene layer at a surface of voids within a porous part of a SiC semiconductor body, wherein the at least one graphene layer constitutes a part of a current path between a first contact at a first side of a semiconductor body and a second contact at a second side of the semiconductor body.

FIG. 3 illustrates a schematic view of a vertical SiC semiconductor power device 300 according to another embodiment. Like the vertical SiC semiconductor power device 100 illustrated in FIG. 1, the vertical SiC semiconductor power device 300 includes a SiC semiconductor body 302, a first contact 308 at a first side 310 of the SiC semiconductor body 302 and a second contact 312 at a second side 314 of the SiC semiconductor body 302.

The vertical SiC semiconductor power device 300 includes an epitaxial SiC layer 306 above a porous SiC substrate 304'. The porous SiC substrate 304' includes a plurality of voids 324 and at least one graphene layer 320 formed at a surface of the voids 324. The voids 324 may be formed within a crystalline SiC substrate by etching the SiC substrate. As an example, the crystalline SiC substrate may be etched with KOH. The at least one graphene layer 320 may be formed at a surface of the voids 324 by thermal decomposition of SiC, for example.

In the embodiment illustrated in FIG. 3, the porous SiC substrate 304' adjoins the epitaxial SiC layer 306. According to other embodiments, only a part of a SiC substrate may be porous. In particular, a bottom part of the SiC substrate may be porous and a top part of the SiC substrate adjoining the epitaxial SiC layer 306 may remain in an unchanged crystalline and non-porous state. According to yet another embodiment, the porosity of SiC may extend through the SiC substrate and into the epitaxial SiC layer 306.

In the vertical SiC semiconductor power device 300, the extension of the porosity of SiC into the SiC semiconductor body 302 may be adjusted relative to an extension of a space charge region into the SiC semiconductor body 302 from an opposite side. Similar to the embodiment illustrated in FIG. 2A, a distance between a space charge region 322 at a maximum operational reverse voltage and the porous SiC substrate 304' is denoted by δ.˜ According to one embodiment, the distance δ is positive, e.g. in a range of 1 μm to 10 μm such as 1 μm, 2 μm, 3 μm, 4 μm, 5 μm. Hence, even at the maximum operational reverse voltage, the space charge region 322 does not reach the porous SiC substrate 304'. According to another embodiment, the distance δ is negative, e.g. in a range of 1 μm to 10 μm such as −1 μm, −2 μm, −3 μm, −4 μm, −5 μm.

A current path between the first contact 308 and the second contact 312 is schematically illustrated by a line 316. The at least one graphene layer 320 constitutes a part of the current path denoted by a line 316a schematically illustrating the current flow including the least one graphene layer 320 at the surface of a plurality of the voids 324. A part of the SiC semiconductor body 302 between the voids 324 is connected in parallel to the at least one graphene layer 320 at the surface of the voids 324. A current flow along the part of the SiC semiconductor body 302 between the voids 324 is schematically illustrated by a line 316b in FIG. 3. Lines 316a and 316b diverge from line 316.

Figure 4:
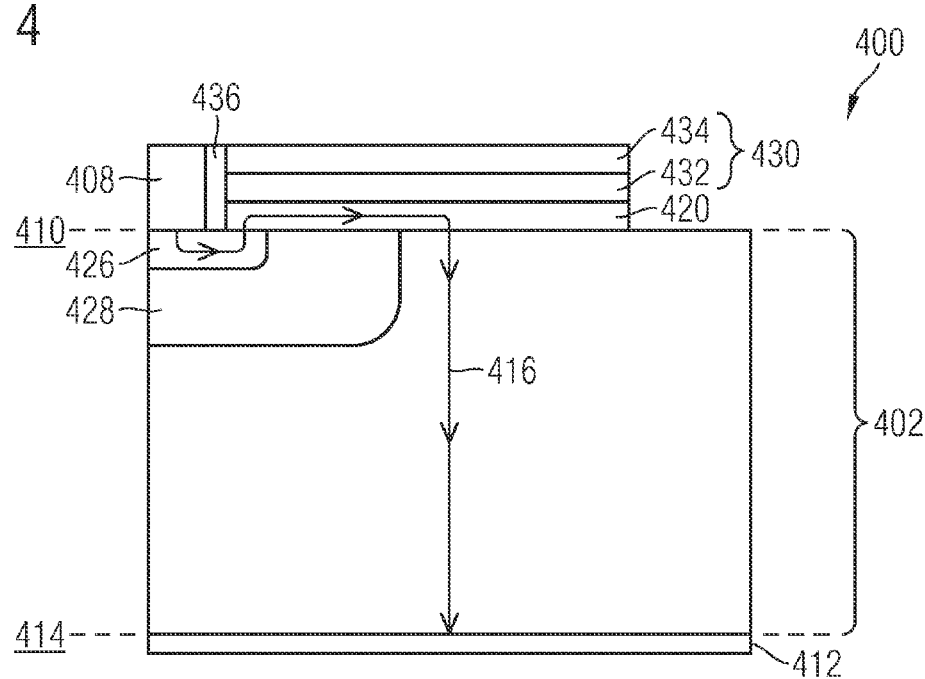
FIG. 4 is a schematic illustration of one embodiment of a SiC vertical semiconductor power device including a current path between a first contact at a first side of a semiconductor body and a second contact at a second side of the semiconductor body, wherein at least one graphene layer at the first side constitutes a channel region.

FIG. 4 illustrates a schematic view of a SiC vertical semiconductor FET 400 according to an embodiment. The vertical SiC semiconductor power FET 400 includes a SiC semiconductor body 402, a first (source) contact 408 at a first side 410 of the SiC semiconductor body 402 and a second (drain) contact 412 at a second side 414 of the SiC semiconductor body 402. A source region 426 is formed within the SiC semiconductor body 402 and is electrically coupled to the source contact 408. The source region 426 is surrounded by a body region 428 formed within the SiC semiconductor body 402. A conductivity type of the source region 426 and of the SiC semiconductor body 402 is opposite the conductivity type of the body region 428. According to one embodiment, the conductivity type of the source region 426 and of the SiC semiconductor body 402 is n-type and the conductivity type of the body region 428 is p-type. According to another embodiment, the conductivity type of the source region 426 and of the SiC semiconductor body 402 is p-type and the conductivity type of the body region 426 is n-type. The conductivity type may be adjusted by appropriate choice of impurities introduced into the respective semiconductor regions, for example.

At least one graphene layer 420, e.g. a 2-atoms thick graphene layer, is formed on the SiC semiconductor body 402 at the first side 410 and covers at least part of the source region 426 and part of the body region 428. The at least one graphene layer 420 constitutes a lateral channel region of the SiC vertical semiconductor power FET 400. A gate structure 430 is formed on the at least one graphene layer 420. The gate structure 430 includes a gate dielectric 432 on the at least one graphene layer 420 and a gate electrode 434 on the gate dielectric 432. The gate electrode 434 is configured to control a conductivity of the at least one graphene layer 420 via a voltage applied to the gate electrode 434. The gate structure 430 is electrically insulated from the source contact 408 by a spacer 436. Alternatively or in addition, a gate structure can be realized below the at least one graphene layer 420, i.e. the at least one graphene layer 420 is formed subsequently to this alternate gate structure.

A current path between the source contact 408 at the first side 410 and the drain contact 412 at the second side 414 is denoted by a line 416 and includes the at least one graphene layer 420 constituting the channel region.

Owing to the high mobility and high concentration of free charge carriers within the at least one graphene layer 420, the resistance of the channel region between the source contact 408 and the drain contact 412 of the vertical SiC semiconductor FET 400 can be decreased. Hence, the specific on-state resistance $R_{on} \times A$ of the SiC vertical power semiconductor FET 400 can be improved.

Figure 5:
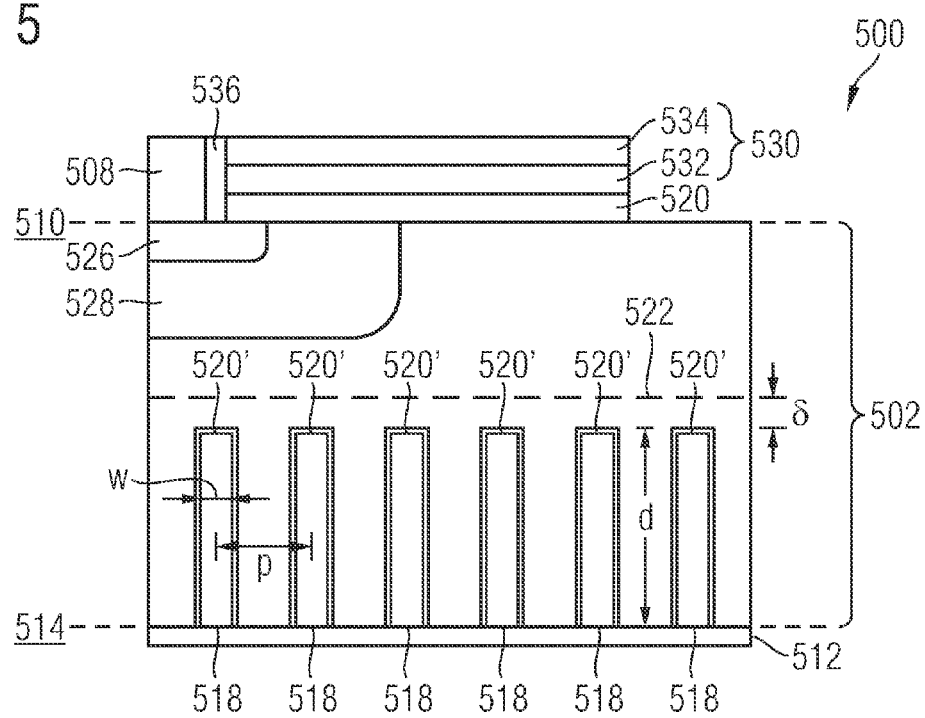
FIG. 5 is a schematic illustration of one embodiment of a SiC vertical semiconductor power device including a current path between a first contact at a first side of a semiconductor body and a second contact at a second side of the semiconductor body, wherein at least one graphene layer constitutes a lateral channel region at the first side and part of a drift zone.

FIG. 5 illustrates a schematic view of a vertical SiC semiconductor FET 500 according to another embodiment. Like the vertical SiC semiconductor power FET 400 illustrated in FIG. 4, the vertical SiC semiconductor power FET 500 includes a SiC semiconductor body 502, a first (source) contact 508 at a first side 510 of SiC the semiconductor body 502 and a second (drain) contact 512 at a second side 514 of the SiC semiconductor body 502. A source region 526 is formed within the SiC semiconductor body 502 and is electrically coupled to the source contact 508. The source region 526 is surrounded by a body region 528 formed within the SiC semiconductor body 502. At least one graphene layer 520 is formed on the SiC semiconductor body 502 at the first side 510 and covers at least part of the source region 526 and body region 528. The at least one graphene layer 520 constitutes a lateral channel region of the vertical SiC semiconductor power FET 500. A gate structure 530 is formed on the at least one graphene layer 520. The gate structure includes a gate dielectric 532 on the at least one graphene layer 520 and a gate electrode 534 on the gate dielectric 532. The gate structure 530 is electrically insulated from the source contact 508 by a spacer 536. Alternatively or in addition, a gate structure can be realized below the at least one graphene layer 520, i.e. the at least one graphene layer 520 is formed subsequently to this alternate gate structure.

In addition to the vertical SiC semiconductor power FET 400 illustrated in FIG. 4 and similar to the vertical SiC semiconductor power device 200 illustrated in FIG. 2A, the vertical SiC semiconductor power FET 500 further includes trenches 518 extending into the SiC semiconductor body 502 from the second side 514. At least one graphene layer 520' is arranged at sidewalls and at a bottom side of each of the trenches 518. With regard to shape, dimensions, materials, distances such as a distance 5 to a space charge region 522, width w, pitch p or depth d, the information given with regard to the embodiments illustrated in FIG. 2A and FIG. 2B applies accordingly.

Figure 6:
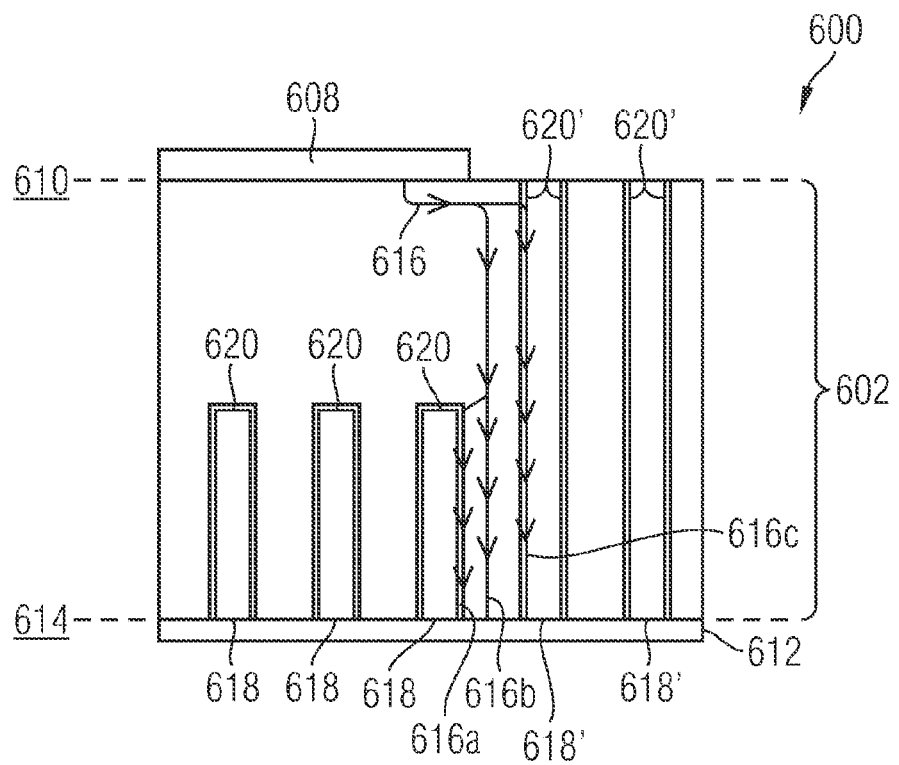
FIG. 6 is a schematic illustration of one embodiment of a SiC vertical semiconductor power device including a current path between a first contact at a first side of a semiconductor body and a second contact at a second side of the semiconductor body, wherein at least one graphene layer arranged at sidewalls of first and second trenches constitutes a part of the current path.

FIG. 6 illustrates a schematic view of a vertical SiC semiconductor power device 600 according to yet another embodiment. Like the vertical SiC semiconductor power device 200 illustrated in FIG. 2A, the vertical SiC semiconductor power device 600 includes a SiC semiconductor body 602, a first contact 608 at a first side 610 of the SiC semiconductor body 602 and second contact 612 at a second side 614 of the SiC semiconductor body 602. First trenches 618 extend into the SiC semiconductor body 602 from the second side 614. At least one graphene layer 620, e.g. a 1 or 2-atoms thick graphene layer, is arranged at sidewalls and at a bottom side of each of the first trenches 618.

In addition to the vertical SiC semiconductor power device 200 illustrated in FIG. 2A, the vertical SiC semiconductor power device 600 further includes second trenches 618' extending through the SiC semiconductor body 602 from the first side 610 to the second side 614. At least one graphene layer 620', e.g. a 1 or 2-atoms thick graphene layer, is arranged at sidewalls of each of the second trenches 618'. In an onstate of the vertical SiC semiconductor power device 600, a current path between the first contact 608 and the second contact 612 is schematically illustrated by a line 616. The at least one graphene layer 620 in the first trenches 618 constitutes part of a current path denoted by a line 616a schematically illustrating the current flow along the least one graphene layer 620 at one sidewall of one of the first trenches 618. The at least one graphene layer 620' in the second trenches 618' constitutes part of a current path denoted by a line 616c schematically illustrating the current flow along the least one graphene layer 620' at one sidewall of one of the second trenches 618'. A part of the SiC semiconductor body 202 between the trenches 618, 618' is connected in parallel to the at least one graphene layers 620, 620' at the sidewalls of the first and second trenches 618, 618'. A current flow along this part of the SiC semiconductor body 602 between the first and second trenches 618, 618' is schematically illustrated by an arrow 616b in FIG. 6. Lines 616a, 616b and 616c diverge from line 616.

Owing to the high mobility and high concentration of free charge carriers within the at least one graphene layer, the resistance of that part of the current path between the first contact 608 and the second contact 612 that includes the at least one graphene layers 620, 620' can be decreased. Hence, the specific on-state resistance $R_{on} \times A$ of the SiC vertical power semiconductor device 600 can be improved.

In a reverse voltage operation mode of the SiC semiconductor power device 600, the at least one graphene layer 620' in the second trenches 618' should be in a non-conductive mode. According to one embodiment, switching of the at least one graphene layer 620' from a conductive mode into the non-conductive mode is effected by pinch-off due to an electric field acting on the at least one graphene layer 620' when a space charge region hits the at least one graphene layer 620'. According to another embodiment switching of the at least one graphene layer 620' from the conductive mode into the non-conductive mode is effected via a gate structure arranged within the second trenches 618'. A vertical extension of the gate structure into the trench may be adapted to the vertical extension of a space charge region into the semiconductor body 602 at a maximum operational reverse voltage. In other words, a bottom side of the gate structure may coincide with or only slightly deviate from a bottom side of the space charge region at the maximum operational reverse voltage. The term "slightly deviate from" means to include small deviations in the range of μm, e.g. +/−1 μm, +/−2 μm and +/−3 μm. Particularly, by changing a voltage applied to the gate electrode of the gate structure, the conductivity of the at least one graphene layer 620' may be switched between an off-mode and an on-mode. In an on-state of the SiC semiconductor power device 600, the at least one graphene layer 620' is in a conductive mode. In a reverse voltage operation mode of the SiC semiconductor power device 600, the at least one graphene layer 620' is in a non-conductive mode. Alternatively or in addition, a gate structure can be realized below the at least one graphene layer 620', i.e. the at least one graphene layer 620' is formed subsequently to this alternate gate structure.

In the embodiment illustrated in FIG. 6, the second trenches 618' extend from the first side 610 to the second side 614. According to another embodiment, the second trenches 618' extend from the first side 610 into the SiC semiconductor body 602. A bottom side of the second trenches 618' ends within the SiC semiconductor body 602 according to this embodiment, e.g. within the drift zone, within an SiC substrate, within an epitaxial SiC layer above the SiC substrate, etc.

According to the embodiment illustrated in FIG. 6, the first trenches 618 and the second trenches 618' are combined. According to other embodiments, only one of the trenches 618, 618' is present.

Figure 7:
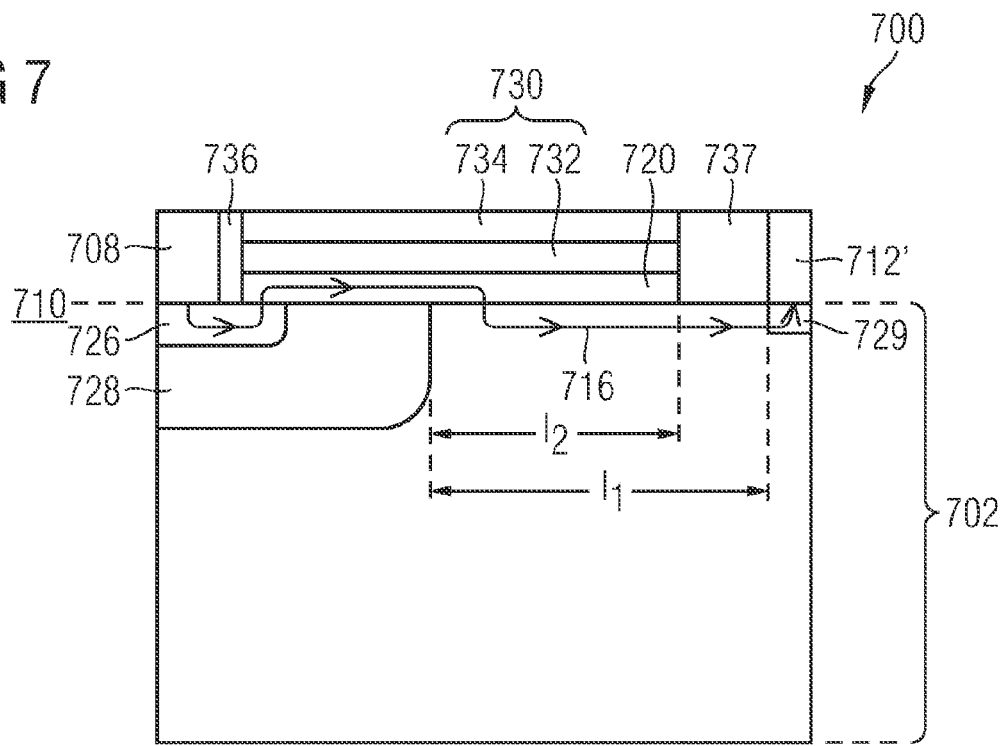
FIG. 7 is a schematic illustration of one embodiment of a SiC lateral semiconductor power device, wherein at least one graphene layer constitutes a lateral channel region.

FIG. 7 illustrates a schematic view of a lateral SiC semiconductor power device 700 according to an embodiment. The lateral SiC semiconductor power device 700 includes a SiC semiconductor body 702, a source contact 708 at a first side 710 of the SiC semiconductor body 702 and a drain contact 712' at the first side 710 of the SiC semiconductor body 702. A source region 726 is formed within the SiC semiconductor body 702 and is electrically coupled to the source contact 708. The source region 726 is surrounded by a body region 728 formed within the SiC semiconductor body 702. A drain region 729 is formed within the SiC semiconductor body 702 and is electrically coupled to the drain contact 712'.

A conductivity type of the source region 726, of the SiC semiconductor body 702 and of the drain region 729 is opposite the conductivity type of the body region 728. According to one embodiment, the conductivity type of the source region 726, the SiC semiconductor body 702 and the drain region 729 is n-type and the conductivity type of the body region 728 is p-type. According to another embodiment, the conductivity type of the source region 726, the SiC semiconductor body 702 and the drain region 729 is p-type and the conductivity type of the body region 726 is n-type. The conductivity type may be adjusted by appropriate choice of impurities introduced into the respective semiconductor regions, for example.

At least one graphene layer 720, e.g. a 1 or 2-atoms thick graphene layer, i.e. a graphene bilayer, is formed on the SiC semiconductor body 702 at the first side 710 and covers at least part of the source region 726 and part of the body region 728. The at least one graphene layer 720 constitutes a lateral channel region of the SiC lateral semiconductor power device 700. A gate structure 730 is formed on the at least one graphene layer 720. The gate structure 730 includes a gate dielectric 732 on the at least one graphene layer 720 and a gate electrode 734 on the gate dielectric 732. The gate electrode 734 is configured to control a conductivity of the at least one graphene layer 720 via a voltage applied to the gate electrode 734. The gate structure 730 is electrically insulated from the source contact 708 by a first insulating spacer 736. The gate structure 730 is electrically insulated from the drain contact 712' by a second spacer insulating 737. Alternatively or in addition, a gate structure can be realized below the at least one graphene layer 720, i.e. the at least one graphene layer 720 is formed subsequently to this alternate gate structure.

A current path between the source contact 708 at the first side 710 and the drain contact 712' at the first side 710 is denoted by a line 716 and includes the at least one graphene layer 720 constituting the channel region.

The semiconductor power device 700 is configured to block reverse voltages of at least 500 V and includes a lateral distance $I_1$ between the body region 728 and the drain contact 712' of at least 5 μm. The lateral distance $I_1$ may be in a range of 5 μm to 70 μm, in particular in a range of 10 μm to 50 μm. A lateral distance $I_2$ between the body region 728 and the second spacer 736 may be in a range of 1 μm to $I_1$-1 μm, for example.

Owing to the high mobility and high concentration of free charge carriers within the at least one graphene layer 720, the resistance of the channel region between the source contact 708 and the drain contact 712' of the lateral SiC power semiconductor device 700 can be decreased. Hence, the specific on-state resistance $R_{on} \times A$ of the lateral SiC power semiconductor device 700 can be improved.

The information given with regard to the embodiment illustrated in FIG. 1 applies accordingly to the other embodiments.

Spatially relative terms such as "under", "below", "lower", "over", "upper", "above" and the like are used for ease of description to explain the positioning of one element relative to a second element. These terms are intended to encompass different orientations of the device in addition to different orientations than those depicted in the figures.

Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and de-scribed herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A vertical semiconductor power device, comprising:
   a SiC semiconductor body, at least part of the SiC semiconductor body constituting a drift zone;
   a first contact at a first side of the SiC semiconductor body;
   a second contact at a second side of the SiC semiconductor body, the first side being opposite the second side;
   a current path between the first contact and the second contact which includes at least one graphene layer; and
   a plurality of first trenches extending into the SiC semiconductor body from the second side, wherein the at least one graphene layer is arranged on at least part of a sidewall of the plurality of first trenches,
   wherein the at least one graphene layer is distinct from a gate-controlled channel-forming region of the vertical semiconductor power device,
   wherein the second contact is formed outside and continuously covers the plurality of first trenches.

2. The vertical power semiconductor device of claim 1, wherein the SiC semiconductor body includes a SiC substrate and an epitaxial SiC layer above the SiC substrate.

3. The vertical power semiconductor device of claim 1, wherein the plurality of first trenches include at least one trench extending into a depth of the SiC semiconductor body in a range of 50 µm to 150 µm, wherein the at least one trench has a width in a range of 50 nm to 500 nm.

4. The vertical power semiconductor device of claim 1, wherein the at least one graphene layer comprises a stack of two or more graphene layers.

5. The vertical power semiconductor device of claim 1, wherein the current path within the drift zone between the first contact and the second contact includes the at least one graphene layer and, connected in parallel, a part of the SiC semiconductor body.

6. The vertical semiconductor power device of claim 1, wherein:
   the vertical semiconductor power device is an FET device; and
   the first contact is a contact to one of a source and drain of the FET device and the second contact is a contact to the other one of the source and drain.

7. The vertical power semiconductor device of claim 1, further comprising a plurality of second trenches extending into the SiC semiconductor body from the first side, wherein a second one of the at least one graphene layer is arranged on at least part of a sidewall of the plurality of second trenches.

8. The vertical power semiconductor device of claim 7, wherein a conductivity type of the drift zone is one of n-type and p-type.

9. The vertical power semiconductor device of claim 7, further comprising an electrode arranged within the plurality of second trenches, the electrode configured to control a conductivity of the second graphene layer via a voltage applied to the electrode.

10. A vertical semiconductor power device, comprising:
    a SiC semiconductor body, at least part of the SiC semiconductor body constituting a drift zone;
    a first contact at a first side of the SiC semiconductor body;
    a second contact at a second side of the SiC semiconductor body, the first side being opposite the second side;
    a plurality of trenches extending into the SiC semiconductor body from the second side; and
    at least one graphene layer arranged on at least part of a sidewall of the plurality of trenches,
    wherein the at least one graphene layer is distinct from a gate-controlled channel-forming region of the vertical semiconductor power device,
    wherein the second contact is formed outside and continuously covers the plurality of first trenches.

11. The vertical power semiconductor device of claim 10, wherein a current path within the drift zone between the first contact and the second contact includes the at least one graphene layer and, connected in parallel, a part of the SiC semiconductor body between the plurality of trenches.

12. The vertical semiconductor power device of claim 10, wherein the first and second contacts are one of a pair of contacts to a source and drain of an FET, of a pair of contacts to a cathode and anode of a diode, or a pair of contacts to an emitter and collector of an IGBT.

\* \* \* \* \*